United States Patent
Restaino et al.

(10) Patent No.: US 6,806,182 B2
(45) Date of Patent: Oct. 19, 2004

(54) METHOD FOR ELIMINATING VIA RESISTANCE SHIFT IN ORGANIC ILD

(75) Inventors: Darryl Restaino, Modena, NY (US); Shahab Siddiqui, Wappingers Falls, NY (US); Erdem Kaltalioglu, Wappingers Falls, NY (US); Delores Bennett, Poughkeepsie, NY (US); Chih-Chih Liu, Hsin-Chu (TW); Hsueh-Chung Chen, Taipei (TW); Tong-Yu Chen, Hsin-Chu (TW); Gwo-Shii Yang, Hsin-Chu (TW); Chiung-Sheng Hsiung, Hsin-Chu (TW)

(73) Assignees: International Business Machines Corporation, Armonk, NY (US); Infineon Technologies, AG, Munich (DE); United Microelectronics Co., Hsin-Chu (TW)

(*) Notice: Subject to any disclaimer, the term of this patent is extended or adjusted under 35 U.S.C. 154(b) by 0 days.

(21) Appl. No.: 10/137,274

(22) Filed: May 1, 2002

(65) Prior Publication Data

US 2003/0207559 A1 Nov. 6, 2003

(51) Int. Cl.⁷ .......................................... H01L 21/4763
(52) U.S. Cl. ........................ 438/623; 438/628; 438/780; 438/781
(58) Field of Search ................................. 438/644, 628, 438/654, 623–624, 780–781; 257/758–760

(56) References Cited

U.S. PATENT DOCUMENTS

| | | | |
|---|---|---|---|
| 4,826,430 A | * 5/1989 | Chen et al. ............... 433/8 |
| 5,658,994 A | 8/1997 | Burgoyne, Jr. et al. | |
| 5,789,325 A | * 8/1998 | Chandra et al. ............ 438/781 |
| 6,020,029 A | 2/2000 | Ferrier et al. | |
| 6,120,639 A | 9/2000 | Redline et al. | |
| 6,166,439 A | 12/2000 | Cox | |
| 6,174,793 B1 | 1/2001 | Tsai et al. | |
| 6,184,284 B1 | * 2/2001 | Stokich et al. ............ 524/500 |
| 6,207,554 B1 | 3/2001 | Xu et al. | |
| 6,211,084 B1 | 4/2001 | Ngo et al. | |
| 6,225,210 B1 | 5/2001 | Ngo et al. | |
| 6,383,913 B1 | * 5/2002 | Tsai et al. .................. 438/624 |
| 6,429,115 B1 | * 8/2002 | Tsai et al. .................. 438/622 |
| 2001/0014529 A1 | * 8/2001 | Chen et al. ................. 438/637 |
| 2001/0029109 A1 | * 10/2001 | Maeda et al. .............. 438/778 |
| 2002/0034647 A1 | * 3/2002 | Chen et al. ................. 428/447 |
| 2002/0052125 A1 | * 5/2002 | Shaffer et al. ............. 438/780 |
| 2002/0164889 A1 | * 11/2002 | Tsai et al. .................. 438/763 |
| 2002/0182857 A1 | * 12/2002 | Liu et al. .................... 438/645 |
| 2003/0036290 A1 | * 2/2003 | Hsieh et al. ............... 438/778 |
| 2003/0073321 A1 | * 4/2003 | Boiteux et al. ............ 438/710 |

\* cited by examiner

*Primary Examiner*—Long Pham
*Assistant Examiner*—Thao X. Le
(74) *Attorney, Agent, or Firm*—Ira D. Blecker

(57) ABSTRACT

Application of an adhesion promoter to a cap layer and oxidation of the adhesion promoter prior to deposition of an organic interlevel dielectric thereon reduces via resistance problems during thermal cycles of semiconductor wafers embodying multiple levels of metal and organic interlevel dielectrics.

9 Claims, 3 Drawing Sheets

US 6,806,182 B2

METHOD FOR ELIMINATING VIA RESISTANCE SHIFT IN ORGANIC ILD

BACKGROUND OF THE INVENTION

1. Field of the Invention

The present invention relates to semiconductor processing and more particularly to the processing of semiconductor wafers that incorporate small design features using advanced processing techniques employing organic interlevel dielectrics.

2. Description of Related Art

Achieving the requisite adhesion between the innumerable miniaturized components, materials and material layers that constitute today's high-density multi-level semiconductor integrated circuits presents an ongoing challenge. The failure of various components, materials and material layers to adhere properly at their interface can result in numerous problems in the fabricated integrated circuit. One aspect of semiconductor circuit fabrication thus involves the identification and resolution of such problems.

U.S. Pat. No. 6,174,793 discloses a method for improving adhesion between a copper layer and a diffusion barrier layer made of silicon nitride by providing an intervening copper phosphide layer to promote adhesion therebetween. Similarly, U.S. Pat. No. 6,211,084 discloses a method for promoting adhesion between a copper layer and a diffusion barrier or capping layer of silicon nitride by treating the copper layer with silane or dichlorosilane plasma to form a copper silicide layer thereon prior to depositing the cap layer. U.S. Pat. No. 6,225,210 achieves the same result by depositing the capping layer on the copper layer under high-density plasma conditions, thus roughening the copper layer surface during deposition and promoting adhesion of the capping layer.

U.S. Pat. No. 6,207,554 discloses employing non-oxide compounds such as $SiN_2$, SiC and related compounds of BC, BCN and BN as an adhesion promoter to promote adhesion between adjacent layers of dielectric material. Similarly, U.S. Pat. No. 6,166,439 discloses a variety of adhesion promoters to promote adhesion between different layered dielectric insulating materials. U.S. Pat. Nos. 6,020,029 and 6,120,639 disclose techniques for improving the adhesion between metal and resinous surfaces in an integrated circuit using an adhesion promoter such as an acidic peroxide or a metal and a reducing agent for the metal.

The use of low dielectric constant organic interlevel dielectric materials (low-k organic ILD materials) has become the industry standard. The increasingly demanding requirements relating to submicron integrated circuitry necessitate the use of organic dielectric insulating materials having extremely low dielectric constants.

The fabrication of a typical level of a multi-level semiconductor integrated circuit generally begins with the deposition of a low-k organic ILD material layer on a cap layer that completes a lower level of the device. The ILD is then patterned and etched to form the requisite trenches and vias forming the desired circuitry for that particular level of the device. A metal, typically copper, is then deposited in the trenches and vias formed in the organic ILD to form, for example, wiring lines on that level and conductive interconnections between levels.

It has now been found that via resistance shift often occurs at the liner/under-Cu interface in submicron semiconductor integrated circuits employing low-k organic ILD materials. This phenomenon has also now been determined to result from weak adhesion between the cap layer of a lower level of the device and the low-k organic ILD deposited thereon.

Needless to say, it would be advantageous if there were a method for fabricating such devices without encountering the undesirable via resistance shift described above and the resulting problems associated therewith.

SUMMARY OF THE PREFERRED EMBODIMENTS

An aspect of the present invention is to achieve a semiconductor multi-level wafer structure employing organic ILD materials as interlevel insulating layers, and preferably low-k organic ILD materials, without creating via resistance shift and associated problems as encountered in the prior art fabrication and use of high density multi-level semiconductor circuits employing organic ILD materials.

Another aspect of the present invention provides an oxidized spin-on coating of an adhesion promoter on a cap layer prior to deposition of an organic ILD layer thereon, and preferably a low-k organic ILD layer, to form a thin silicon-dioxide-like layer that promotes adhesion therebetween and eliminates via resistance shift problems that would otherwise occur during thermal cycles of the fabricated integrated circuit.

In accordance with a first embodiment of the present invention, there is provided a method for preventing via resistance shift in an organic interlevel dielectric in a damascene or dual damascene process comprising coating a previously-formed cap layer with a layer of an adhesion promoter; oxidizing the adhesion promoter layer to form a silicon-dioxide-like film layer on the cap layer; and then applying a coating comprising an organic interlevel dielectric to the silicon-dioxide-like film layer.

Preferably, and most advantageously, the organic interlevel dielectric is a low dielectric constant organic interlevel dielectric material (low-k organic ILD material) such as SILK or porous-SILK. Additionally, it is preferable to apply a fresh adhesion promoter layer to the silicon-dioxide-like film layer prior to applying the organic interlevel dielectric thereto.

In accordance with another embodiment of the present invention, there is provided a method for treating an adhesion promoter coating on a cap layer of one level of a multi-level semiconductor substrate, the method including oxidizing the adhesion promoter layer to form a silicon-dioxide-like film layer on the cap layer by subjecting the adhesion promoter layer to an $O_2$ plasma treatment. In a preferred embodiment, the plasma treatment utilizes $O_2/N_2H_2$ inductively-coupled downstream plasma (ICP) provided under specific preferred conditions.

DETAILED DESCRIPTION OF THE PREFERRED EMBODIMENTS

Figure 1:
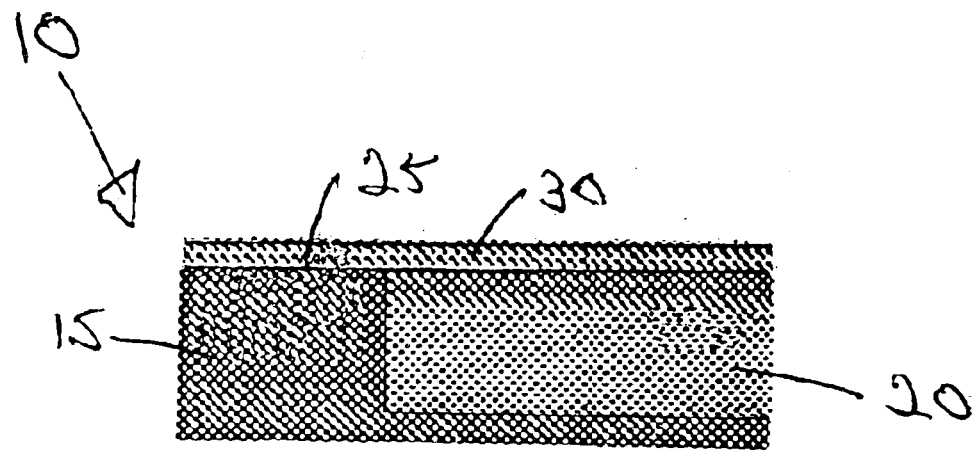
FIG. 1 is a cross-sectional side view of one detail of a fabricated level of a multi-level high-density semiconductor wafer.

An embodiment of the present invention will now be described with reference to FIGS. 1–4. As shown in FIG. 1, a multi-level high-density semiconductor wafer includes a first or prior lower level 10 including any known or suitable dielectric material 15 surrounding a metal wiring line 20, e.g., a copper wiring line. Level 10, including dielectric material 15 and metal wiring line 20, is completely covered by a cap layer 30 made of any suitable or known cap material, e.g., a cap nitride layer such as silicon nitride.

The various components of level 10 are formed by conventional techniques. Thus, the dielectric material 15 is applied or deposited by any suitable or known method, such as chemical vapor deposition (CVD) or spin-on coating. Dielectric material 15 is preferably an organic interlevel dielectric material and more preferably a low-k organic dielectric material. Various trenches and vias are patterned into deposited dielectric material 15 by any suitable or conventional photolithographic and/or etching techniques.

One or more metals, for example and preferably Cu, are thereafter deposited on the surface of patterned dielectric material 15, covering the surface of dielectric material 15 and filling the trenches and vias to form conductive interconnections between levels and a pattern of metal wiring lines on level 10, including metal wiring line 20. Any suitable or conventional deposition technique, such as sputtered deposition of a copper seed layer followed by either electroplating or electroless plating, may be employed in this metal deposition step.

The metal-covered surface of dielectric material 15 is then polished, e.g., by chemical mechanical polishing (CMP), to remove deposited metal and expose the surface 25 of dielectric material 15, while the vias and trenches, such as the trench filled with Cu metal 20, remain substantially filled but not overflowing with metal. Cap layer 30 is then deposited by any suitable or known technique, such as CVD or plasma enhanced chemical vapor deposition (PECVD).

Figure 2:
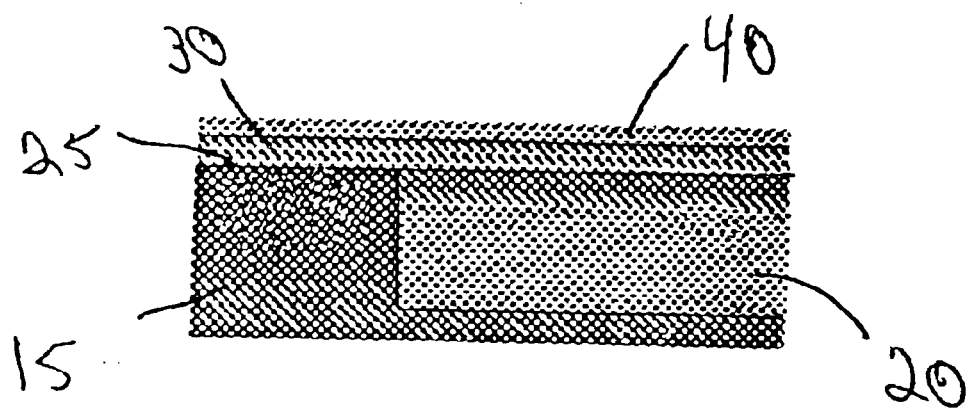
FIG. 2 is a cross-sectional side view illustrating a first method step in accordance with one embodiment of the method of the present invention in which an adhesion promoter is applied to the cap layer shown in FIG. 1.

As shown in FIG. 2, cap layer 30 is then coated with a thin layer 40 of an adhesion promoter. Any suitable adhesion promoter that upon appropriate treatment can be converted into a silicon-dioxide-like film may be employed in the present invention, including various silane coupling agents known as adhesion promoters.

A particularly suitable and preferred adhesion promoter is AP-4000, a vinyltriacetoxysilane-based adhesion promoter sold under the trademark AP-4000 that is available commercially from the Dow Chemical Company of Midland, Mich. The adhesion promoter contains silicon, oxygen and carbon and is thus convertible through oxidizing to a silicon-dioxide-like film.

One suitable application technique for the adhesion promoter, for example, is application to a film thickness of approximately 120 A°, with a typical range of about 90 to about 140 A°. The adhesion promoter is preferably spin-on applied and is applied prior to subsequent deposition of an organic ILD coating in order to enhance adhesion of the ILD coating to cap layer 30.

Figure 3:
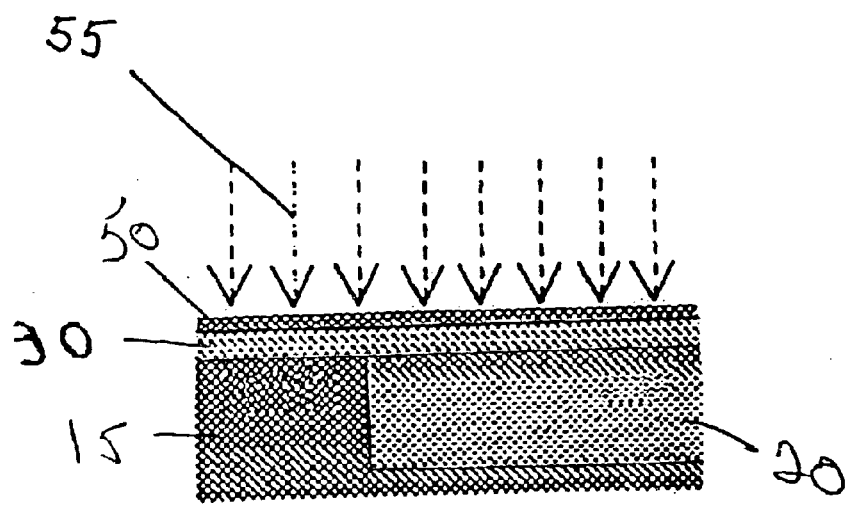
FIG. 3 is a cross-sectional side view illustrating a second method step in accordance with one embodiment of the method of the present invention in which the applied adhesion promoter shown in FIG. 2 is oxidized.

As shown in FIG. 3, thin adhesion promoter layer 40 is then oxidized to form a thin silicon-dioxide-like film 50 on cap layer 30. The adhesion promoter can be oxidized by any suitable or known technique, including oxidation via $O_2$ plasma treatment 55.

A preferred plasma treatment utilizes $O_2/N_2H_2$ inductively-coupled downstream plasma (ICP). The preferred plasma treatment operates at a preferred wafer temperature of about 250° C., with a workable range of about 150 to about 300° C. The oxygen flow rate is preferably 4200 sccm, with a workable range of about 3500 to about 5000 sccm. The $N_2H_2$ flow rate is preferably 200 sccm, with a workable range of about 100 to about 500 sccm. The reactor pressure is preferably 1.1 Torr, with a workable range of about 0.9 to about 2.0 Torr. Finally, the plasma power is preferably 900W, with a workable range of about 500 to about 1000W. This preferred process has a very wide range of effective plasma treatment time, preferably ranging from about 3 seconds to about 180 seconds, with no deleterious effects observed from extensive plasma bombardment.

The $O_2$ plasma treatment removes the organic carbon portion of the adhesion promoter, leaving a layer 50 of $SiO_x$ film on the wafer surface, as confirmed by XPS. This silicon dioxide-like film contains silicon and oxygen, but not necessarily in an exact ratio yielding $SiO_2$. A typical range for the thickness of this oxide-like film is about 40 A° to about 60 A°.

Table 1 below illustrates the reduction of the carbon content in the adhesion promoter layer after $O_2$ plasma treatment.

TABLE 1

| Test Sample | Oxygen Content | Carbon Content | Silicon Content | Film Thickness (SiOx) |
|---|---|---|---|---|
| As-Deposited | 39.89% | 39.68% | 20.43% | Approximately 100 A° |
| After $O_2$ Plasma | 71.12% | 3.96% | 24.92% | Approximately 50 A° |

As shown by the example reported in Table 1, oxidizing of the applied adhesion promoter layer substantially reduces and effectively removes the carbon content thereof, leaving a layer of $SiO_x$ film on the wafer surface. In the example reported in Table 1, the carbon content of the adhesion promoter is reduced from about 39.68% by weight to about 3.96% by weight as a result of oxidizing the adhesion promoter coating via $O_2$ plasma treatment conducted under the preferred operating parameters described above. Conversely, the oxygen content increases from about 39.89% by weight to about 71.12% by weight as a result of the oxidizing treatment.

Figure 4:
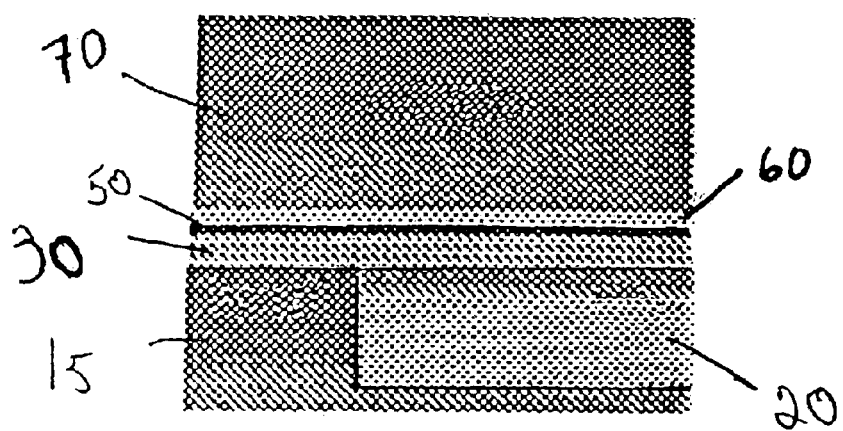
FIG. 4 is a cross-sectional side view illustrating a third method step in accordance with one embodiment of the method of the present invention in which an organic interlevel dielectric is applied to the treated surface shown in FIG. 3.

After silicon-dioxide-like film 50 has been formed, and as shown in FIG. 4, a fresh layer of adhesion promoter 60 is preferably applied thereover to a thickness preferably ranging from about 90 to about 140 A°. This optimized adhesion promoter film thickness range is chosen based upon process integration concerns. In this regard, if the adhesion promoter layer 60 is too thick, then the effective dielectric constant of the interlevel dielectric is significantly increased, which is not preferable. Conversely, if the adhesion promoter layer 60 is too thin, then it is unable to adequately planarize topographical features of the damascene structure, which also is undesirable and not preferred.

After deposition of the fresh layer of adhesion promoter 60, interlevel dielectric material is then deposited to form dielectric material insulating layer 70. Dielectric material 70 is preferably an organic interlevel dielectric material and more preferably a low-k organic dielectric material.

The present invention is particularly advantageous when any organic ILD is employed as an interlevel dielectric. A low-k organic ILD is most preferred. Moreover, it is particularly advantageous, and most preferable, when the organic ILD is SILK, a particular low-k dielectric material sold under the trademark SILK by the Dow Chemical Company of Midland, Mich. SILK is an organic thermosetting polymer recently being used as a new low dielectric constant material for intermetal insulation.

The SILK dielectric is applied in a spin-on coating process, for example, initially cured and then baked to complete formation of the interlevel dielectric (ILD) layer 70. Further by way of example only, it can be processed in a wafer track similar to that conventionally employed for lithography photoresist. The SILK material is applied in liquid form and dries quickly during the spin-on coating.

In one advantageous embodiment, fresh adhesion promoter layer 60 is formed from AP-4000 adhesion promoter and insulating layer 70 is formed from a porous low-k dielectric material such as porous SILK. Porous low-k dielectric material compositions are described, for example, in U.S. Pat. No. 6,107,357, the contents of which are incorporated fully herein by reference.

After formation of dielectric insulating layer 70, the new level of the wafer is subjected to the damascene/dual damascene process in a conventional manner.

The application of organic ILD material as an insulating layer between each and every level of a multi-level high-density semiconductor fabrication can be performed in the above-described manner. The silicon-dioxide-like layer improves the mechanical strength of the adhesion between the liner/under-Cu interface, thus diminishing the via shift resistance problem conventionally observed during thermal cycles.

Comparative Tests

Figure 5:
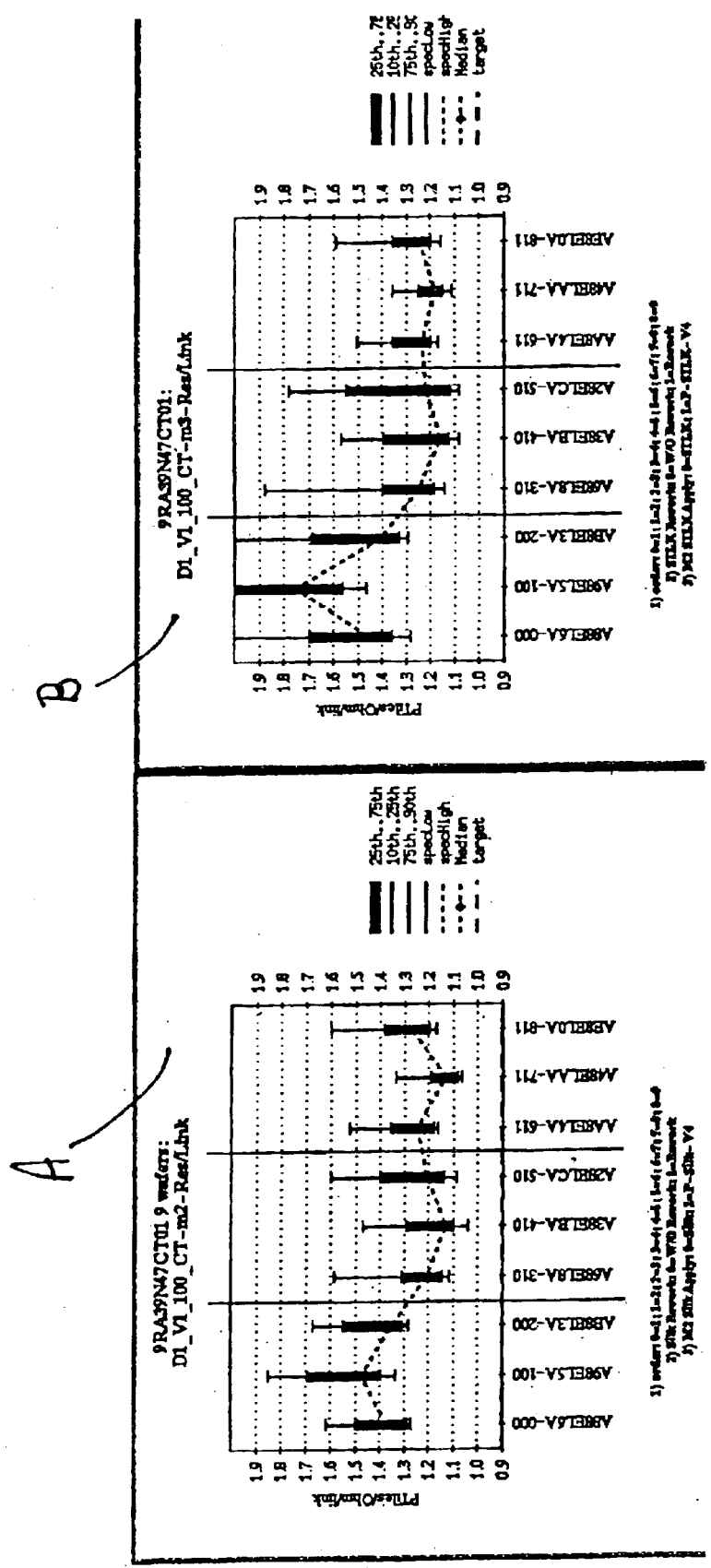
FIG. 5 is a Comparative Chart of the via resistance shift observed in conventional multi-level semiconductor wafer structures versus the lack of via resistance shift observed in similar semiconductor wafer structures fabricated by the methods of the present invention.

FIG. 5 is a Comparative Chart comparing the via resistance shift observed in conventional multi-level semiconductor wafer structures and the lack of via resistance shift observed in similar semiconductor wafer structures fabricated by the methods of the present invention. This Comparative Chart confirms that the methods of the present invention eliminate the shift in via resistance that occurs in conventional methods when, for example, a third metal level is deposited on top of a second metal level in multi-level fabricated semiconductor wafers.

The left Graph A of FIG. 5 shows via resistance measured after formation of the second metal level while the right Graph B of FIG. 5 shows the same test structures measured for via resistance after formation of the third metal level. Each of Graphs A and B shown in FIG. 5 illustrates three groups of three wafers processed in different manners. The left group of three wafers in each of Graphs A and B have been processed by conventional methods, including deposition of an adhesion promoter layer followed by deposition of an intermetal dielectrics layer, without any intervening oxidizing of the adhesion promoter layer. The middle group of three wafers in each of Graphs A and B have been processed by plasma treatment of an adhesion promoter layer followed by deposition of a SILK dielectric layer on the resulting silicon-dioxide-like film, in accordance with an embodiment of the present invention. The right group of three wafers in each of Graphs A and B have been processed by plasma treatment of an adhesion promoter layer followed by deposition of a porous SILK dielectric layer on the resulting silicon-dioxide-like film, in accordance with another embodiment of the present invention.

In the FIG. 5 Graphs A and B, the y-axis represents the ohms measured for each tested via link (0.9 to 1.9 ohms scale). Each location on the x-axis represents one of 9 individual wafers. The dotted lines between and connecting wafers intersect each wafer at a point representing the average ohm resistance measurement value for 100 measured vias at the given wafer level (second or third).

As shown in FIG. 5, in the conventional prior art process (the left wafer group in each of Graphs A and B), about 10% via resistance shift is observed after deposition of the third metal level (M3) in a semiconductor multi-level wafer structure employing SILK as the organic ILD insulating material. This is observed by comparing the median resistance of the 3 wafers on the left side of each of Graphs A and B shown in FIG. 5. An increase in values between the two graphs denotes the shift in via resistance, i.e., the increase in via resistance that results from formation of the third metal level.

Conversely, virtually no via resistance shift is observed in similar wafers wherein, in accordance with the present invention, an adhesion promoter is coated on the wafer surface and oxidized prior to deposition of either SILK or porous SILK as the organic ILD. This is seen by comparing the measurement results for the middle group of 3 wafers (SILK) and the 3 wafers shown on the right side (porous SILK) of each of Graphs A and B, respectively.

While the present invention has been described in terms of certain particular preferred embodiments, those of ordinary skill in the art will appreciate that various modifications, variations, alternatives and extensions may be made without departing from the basic teachings of the present invention. As such, the present invention is not to be limited to the specific embodiments described herein. Rather, the scope of the present invention is to be determined from the claims, which follow.

What is claimed:

1. A method for preventing via resistance shift in an organic interlevel dielectric in a damascene or dual damascene process, comprising:
    coating a previously-formed cap layer with a layer of an adhesion promoter;
    oxidizing the first adhesion promoter layer to form a silicon-dioxide-like film layer on the cap layer;
    applying a second adhesion promoter layer to the silicon-dioxide-like film layer; and
    applying a coating of an organic interlevel dielectric to the second adhesion promoter layer.

2. A method according to claim 1, wherein the first adhesion promoter layer is AP-4000.

3. A method according to claim 1, wherein the second adhesion promoter layer is AP-4000.

4. A method according to claim 1, wherein the oxidizing step is performed using an $O_2$ plasma treatment.

5. A method according to claim 1, wherein the first adhesion promoter layer has a thickness ranging from about 90 to about 140 A°.

6. A method according to claim 1, wherein the second adhesion promoter layer has a thickness ranging from about 90 to about 140 A°.

7. A method according to claim 1, wherein the silicon-dioxide-like film layer has a thickness ranging from about 40 to about 60 A°.

8. A method according to claim 1, wherein the organic interlevel dielectric is a low-k organic interlevel dielectric.

9. A method according to claim 1, wherein the organic interlevel dielectric is selected from the group consisting of SILK and porous SILK.

* * * * *